United States Patent [19]

Kobayashi et al.

[11] Patent Number: 4,746,377
[45] Date of Patent: May 24, 1988

[54] SEMICONDUCTOR DEVICE WITH THERMALLY OXIDIZED INSULATING AND ARSENIC DIFFUSION LAYERS

[75] Inventors: Kiyoteru Kobayashi; Hideaki Arima, both of Itami, Japan

[73] Assignee: Mitsubishi Denki Kabushiki Kaisha, Tokyo, Japan

[21] Appl. No.: 823,251

[22] Filed: Jan. 28, 1986

[30] Foreign Application Priority Data

Mar. 8, 1985 [JP] Japan .................................. 60-47032

[51] Int. Cl.$^4$ ........................................ H01L 21/425
[52] U.S. Cl. ......................... 148/33.3; 148/DIG. 37; 437/40; 357/23.1
[58] Field of Search ........... 148/33, 33.1, 33.3, 148/33.6, DIG. 30, 37; 437/40, 141, 161; 357/23.1

[56] References Cited

U.S. PATENT DOCUMENTS

| | | | |
|---|---|---|---|
| 3,988,181 | 10/1976 | Imai et al. ............................ | 148/188 |
| 4,183,134 | 1/1980 | Oehler et al. ........................ | 29/571 |
| 4,210,689 | 7/1980 | Komatsu ............................... | 427/88 |
| 4,274,892 | 6/1981 | Templin ............................... | 148/188 |
| 4,329,773 | 5/1982 | Geipel, Jr. et al. .................. | 29/571 |
| 4,676,845 | 6/1987 | Spitzer ............................... | 148/33.3 |

OTHER PUBLICATIONS

Gow, III et al., "Tunnel Diode Fabrication", IBM Tech. Disc. Bull., vol. 5, No. 12, (May 1963), p. 61.
Translation of the S. Morita et al., publication Proceedings, 14a-B-9, the 1984 Autumn Meeting of Japanese Applied Physics, p. 432.

*Primary Examiner*—Olik Chaudhuri
*Attorney, Agent, or Firm*—Lowe, Price, LeBlanc, Becker & Shur

[57] ABSTRACT

In a surface region of a silicon semiconductor substrate (10), an arsenic diffusion layer (20) having a surface arsenic concentration of $5 \times 10^{18}$ cm$^{-3}$ to $5 \times 10^{19}$ cm$^{-3}$ is formed and then, the arsenic diffusion layer (20) is oxidized by a thermal oxidation method so that a thermally oxidized film (30) is formed on the arsenic diffusion layer (20). Thus, an insulating film (30) having an excellent insulating characteristic can be obtained, and therefore a MOS type semiconductor device with an excellent insulating characteristic can be obtained.

3 Claims, 4 Drawing Sheets

SEMICONDUCTOR DEVICE WITH THERMALLY OXIDIZED INSULATING AND ARSENIC DIFFUSION LAYERS

BACKGROUND OF THE INVENTION

1. Field of the Invention

The present invention relates to a semiconductor device and a method of manufacturing thereof. Particularly, the present invention relates to a method of forming on a surface of a silicon semiconductor substrate, an insulating film unlikely to cause a dielectric breakdown, as well as to a semiconductor device having the above stated insulating film.

2. Description of the Prior Art

FIG. 1A is a sectional view showing schematically a structure of a conventional semiconductor device of metal-oxide-semiconductor (MOS) type. In FIG. 1A, a semiconductor device, that is, a MOS capacitor for example comprises a silicon semiconductor substrate 1, a silicon oxide film 2 formed on the silicon semiconductor substrate 1 by a thermal oxidation method and an electrode layer 3 formed of polysilicon for example. The silicon oxide film 2 serves as a dielectric layer.

FIG. 1B is a sectional view showing schematically a structure of another conventional semiconductor device of MOS type. The semiconductor device shown in FIG. 1B comprises: a silicon semiconductor substrate 1; an impurity diffusion layer 4 formed by diffusion of an impurity such as boron, arsenic or phosphorus in a surface of the siliocn semiconductor substrate 1; a silicon oxide film 2 formed on the impurity diffusion layer 4 by thermal oxidation of the impurity diffusion layer 4; and an electrode layer 3 formed on the silicon oxide film 2. The silicon oxide film 3 serves as a dielectric layer between the electrode layer 3 and the silicon substrate 1 or between the electrode layer 3 and the impurity diffusion layer 4. It is generally said that an electric field effecting a dielectric breakdown on a silicon oxide film formed by a thermal oxidation method is approximately 10 MV/cm. However, with an electric field of less than 10 MV/cm, a dielectric breakdown of a silicon oxide film would also be caused as the electric field applying time proceeds. Such dielectric breakdown phenomenon in a dielectric film caused with the passage of the electric field applying time is called TDDB (Time Dependent Dielectric Breakdown). The mechanism of the TDDB has not been clarified so far.

In the operation of such a semiconductor device as shown in FIG. 1A or FIG. 1B, a predetermined electric field is applied between the electrode layer 3 and the silicon substrate 1 or the impurity diffusion layer 4 so that the silicon oxide film 2 is exposed to the electric field. If a TDDB phenomenon occurs in the silicon oxide film 2 by the application of the electric field, insulation defective is effected between the electrode layer 3 and the silicon substrate 1 or the impurity diffusion layer 4, resulting in a malfunction of the semiconductor device. As described previously, in the MOS type semiconductor devices, a silicon oxide film formed on the surface of the silicon substrate with thermal oxidation of an impurity diffusion layer is used as an insulating film (or a dielectric film). However, in a conventional device, no consideration is given to the relation between the quality or the concentration of the impurity in the underlying impurity diffusion layer and the time elapsed to cause a TDDB in the silicon oxide film formed by the thermal oxidation. Consequently, a disadvantage is involved in that the time elapsed until a dielectric breakdown occurs in the silicon oxide film is sometimes shorter than an estimated value in design (or in specification). A relation between the dose of impurity implanted in an impurity diffusion layer and the endurance of a silicon oxide film is disclosed by S. Morita et al. in the Proceedings, l4a-B-9, the 1984 Autumn Meeting of Japan Applied Physics.

SUMMARY OF THE INVENTION

An object of the present invention is to provide a semiconductor device comprising a silicon oxide film unlikely to cause a dielectric breakdown and a method of manufacturing thereof, by which the above described disadvantages can be eliminated.

A semiconductor device in accordance with the present invention comprises: an impurity diffusion layer of arsenic having a surface impurity concentration of $5 \times 10^{18}$ cm$^{-3}$ to $5 \times 10^{19}$ cm$^{-3}$ and formed in a surface of a silicon semiconductor substrate; a silicon oxide film formed on the impurity diffusion layer by thermal oxidation of the impurity diffusion layer; and a conductive layer formed on the silicon oxide film.

A method of manufacturing a semiconductor device in accordance with the present invention comprises the steps of: forming a diffusion layer of arsenic, having a surface impurity concentration of $5 \times 10^{18}$ cm$^{-3}$ to $5 \times 10^{19}$ cm$^{-3}$ in a predetermined region of a surface of a silicon semiconductor substrate; and forming a silicon oxide film on the arsenic diffusion layer by thermal oxidation of the arsenic diffusion layer.

It is experimentally ascertained that a silicon oxide film formed by thermal oxidation of an arsenic diffusion layer having a surface impurity concentration of $5 \times 10^{18}$ cm$^{-3}$ to $5 \times 10^{19}$ cm$^{-3}$ is least liable to cause a TDDB and therefore, by using such a silicon oxide film as a dielectric film, a semiconductor device having an excellent insulation characteristic can be obtained.

The above described object and other objects and features of the present invention will become more apparent from the following detailed description when taken in conjunction with the accompanying drawings.

DETAILED DESCRIPTION OF PREFERRED EMBODIMENT

FIGS. 2A to 2D are sectional views showing successive steps of a method of manufacturing of a semiconductor device in an embodiment of the present invention. Referring to FIGS. 2A to 2D, a method of manufacturing of a semiconductor device in accordance with the present invention will be described in the following.

Figure 1A:
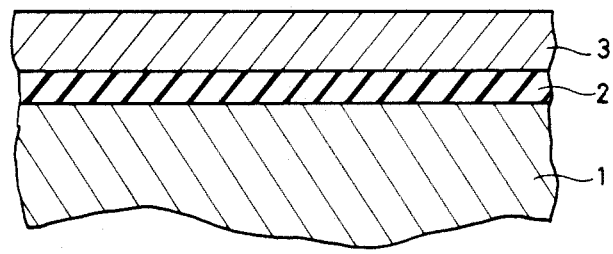
FIG. 1A is a sectional view schematically showing a structure of a conventional semiconductor device of MOS type.
Figure 1B:
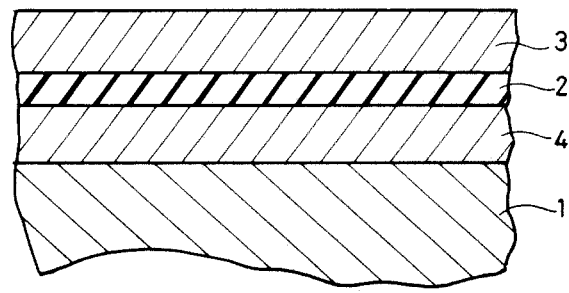
FIG. 1B is a sectional view showing a structure of another conventional semiconductor device of MOS type.
Figure 2A:
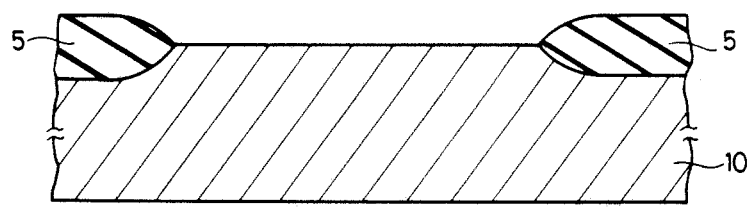
FIGS. 2A to 2D are views showing a method of manufacturing of a semiconductor device in an embodiment of the present invention.

In FIG. 2A, a thick silicon oxide film (a field oxide film) 5 for device isolation is formed in a predetermined region in a silicon semiconductor substrate 10. This thick silicon oxide film 5 is formed by the same method as in a conventional device.

Figure 2B:
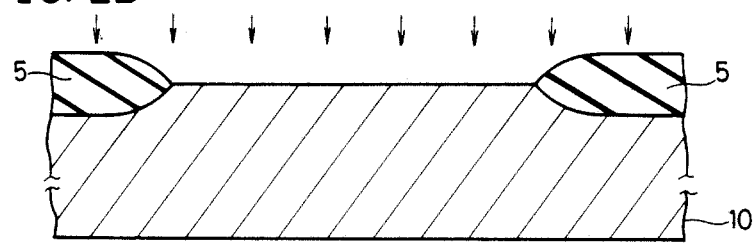

In FIG. 2B, arsenic is introduced into the surface region of the silicon semiconductor substrate 10. For the introduction of arsenic, an ion implantation method, a thermal diffusion method or the like is available. In this embodiment, arsenic is introduced with an ion implantation method. For the purpose of comparison, n-type silicon semiconductor substrates each having a crystal face (100) and a specific resistance of 0.5 to 1.00 cm were used as samples and the ion implantation method for introducing arsenic was adopted with an acceleration voltage of 50 keV and seven doses of implantation of 0, $1\times10^{14}$ cm$^{-2}$, $5\times10^{14}$ cm$^{-2}$, $1\times10^{15}$ cm$^{-2}$, $2\times10^{15}$ cm$^{-2}$, $3\times10^{15}$ cm$^{-2}$ and $4\times10^{15}$ cm$^{-2}$.

Figure 2C:
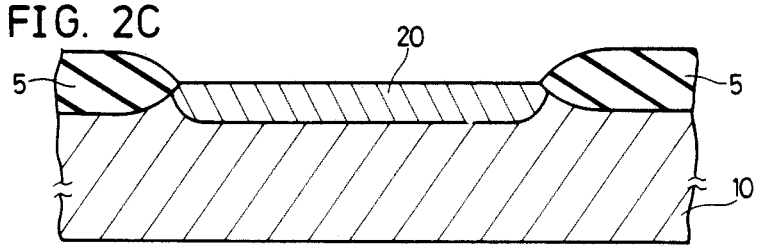

In FIG. 2C, a silicon oxide film (not shown) having a thickness of approximately 300 Å is formed on the surface of the diffusion layer 20 in an atmosphere of oxygen at 900° C. Subsequently, in an atmosphere of nitrogen at 1050° C., heat treatment is applied for 20 minutes so as to perform processes such as diffusion of arsenic and annealing of the arsenic implanted layer. Then, the silicon oxide film of a thickness of 300 Å is removed. Thus, an arsenic diffusion layer 20 having a surface arsenic concentration (a concentration of arsenic at the surface of the diffusion layer 20) of $5\times10^{18}$ cm$^{-3}$ to $5\times10^{19}$ cm$^{-3}$ is obtained.

The arsenic concentration at the surface of the arsenic diffusion layer 20 is made most suitable by controlling the parameters for ion implantation (for example, an acceleration voltage and a dose of implantation) and the parameters for heat treatment after the ion implantation (for example, a process time, a process temperature etc.).

For the purpose of confirming the result, the surface arsenic concentration of each of the samples formed of seven doses of implantation for comparison as described above are measured by using a secondary ion mass spectrometer (SIMS) method, after the removal of silicon oxide film of a thickness of 300 Å.

Figure 2D:
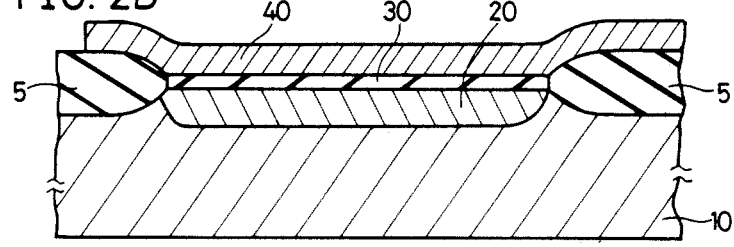

In FIG. 2D, the arsenic diffusion layer 20 formed by the same manufacturing steps as for the samples is thermally oxidized in an atmosphere of oxygen diluted by nitrogen at a temperature of 1000° C. so that a thermally oxidized silicon oxide film 30 of a thickness of approximately 100Å is formed on the arsenic diffusion layer 20. Then, an electrode layer 40 of a polycrystalline silicon film or the like is formed on the silicon oxide film 30 using a CVD (chemical vapor deposition) method or the like and after that, the electrode layer 40 is patterned using a photolithography and etching technique known in the art. Thus, a semiconductor device of MOS structure is obtained.

Now, in the following, the excellent insulation characteristic of a silicon oxide film formed by thermal oxidation of an arsenic diffusion layer having a surface arsenic concentration of $5\times10^{18}$ cm$^{-3}$ to $5\times10^{19}$ cm$^{-3}$ will be specifically described using experimental data.

Figure 3:
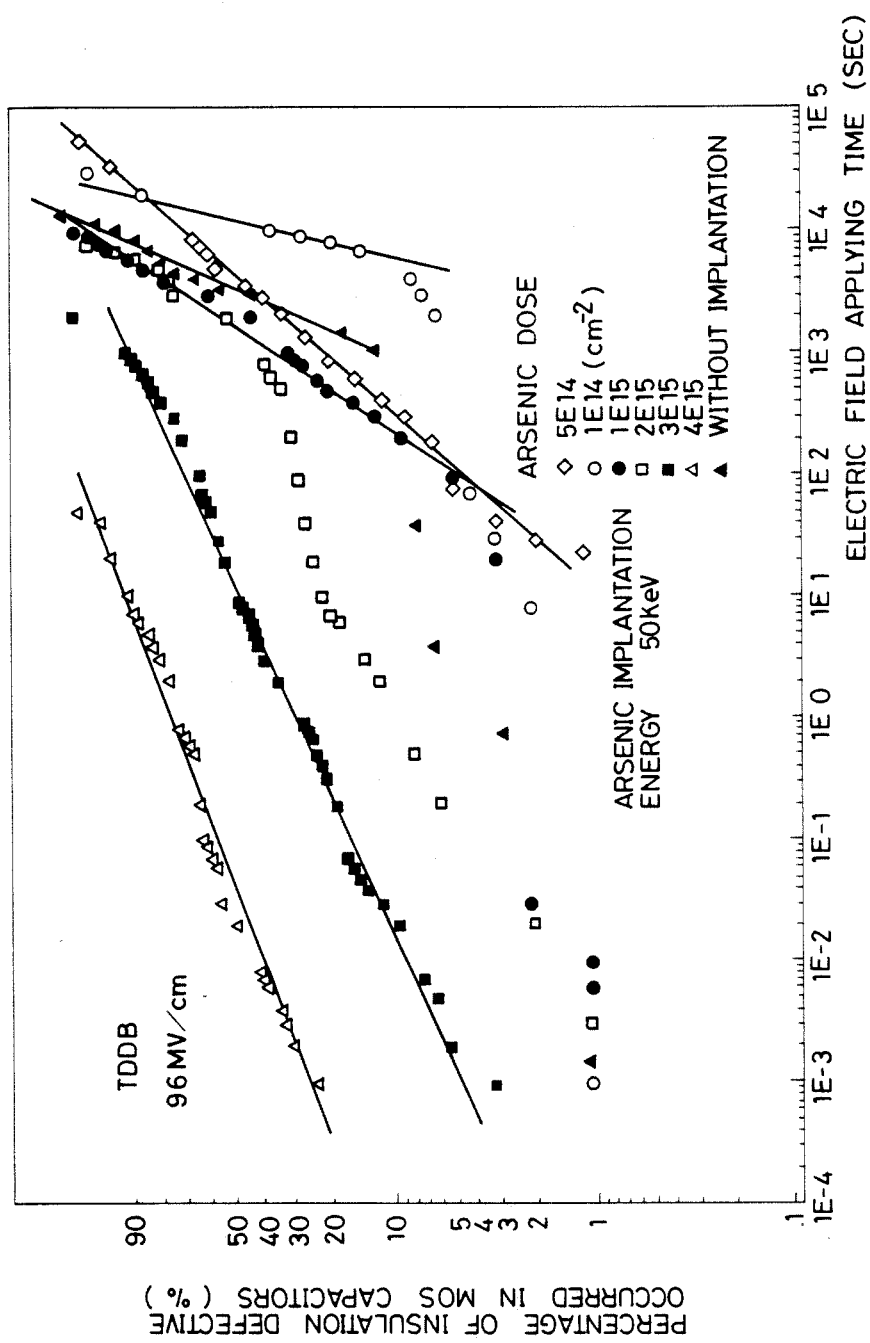
FIG. 3 is a graph showing a relation between the percentage of insulation defective in MOS capacitors formed in accordance with the present invention and the electric field applying time.

FIG. 3 is a graph showing a relation between the percentage of insulation defective in MOS capacitors manufactured by the above described manufacturing method and the electric field applying time. In FIG. 3, the MOS capacitors used as samples are MOS capacitors of an area of 0.5 mm$^2$, each comprising a polysilicon layer 40, a silicon oxide film 30 and an n type silicon substrate 10. An electric field of 9.6 MV/cm is applied between the polysilicon layer 40 and the n type silicon substrate 10 so that the polysilicon layer 40 is exposed to a high potential. In FIG. 3, the horizontal axis represents the electric field applying time (sec.) and the vertical axis represents the percentage (%) of the MOS capacitors in which an insulation defective occurs in a silicon oxide film due to a dielectric breakdown, the arsenic dose of implantation being used as a parameter.

As can be seen clearly from FIG. 3, the time required to cause a TDDB in a silicon oxide film changes considerably depending on the dose of implantation.

In this case, the insulation characteristic of the thermally oxidized silicon oxide film is considered to be governed mostly by the surface arsenic concentration of the underlying arsenic diffusion layer. Therefore, a relation between the surface arsenic concentration and the thermally oxidized silicon oxide film should be considered.

Figure 4:
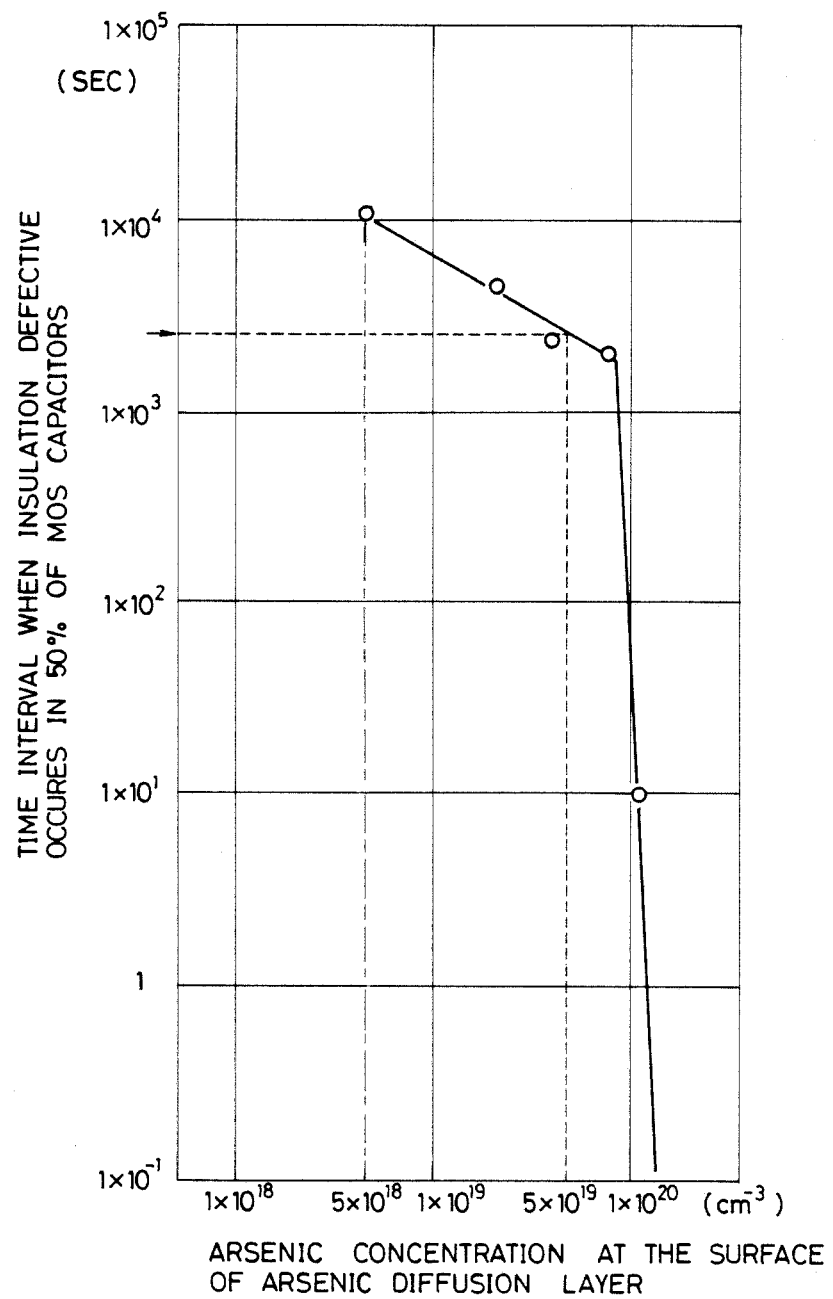
FIG. 4 is a graph showing a relation between the time elapsed until insulation defective occurs in 50% of the MOS capacitors and the surface impurity concentration of the arsenic diffusion layer.

FIG. 4 is a graph showing a relation between the surface arsenic concentration and the time required till the percentage of insulation defective in MOS capacitors shown in FIG. 3 attains 50%. In FIG. 4, the vertical axis represents the time required till the percentage of insulation defective in MOS capacitors calculated from the data shown in FIG. 3 attains 50% and the horizontal axis represents the surface arsenic concentration measured by using a SIMS method in the step shown in FIG. 2C. The time taken for the percentage of insulation defective in MOS capacitors formed without implantation of arsenic to attain 50% is shown by an arrow in FIG. 4. This time interval corresponds to the time interval when the percentage of insulation defective in the MOS capacitor comprising a silicon oxide film obtained by thermal oxidation of an arsenic diffusion layer having a surface arsenic concentration of $5\times10^{19}$ cm$^{-3}$ attains 50%. As can be seen from FIG. 4, a silicon oxide film obtained by thermal oxidation of an arsenic diffusion layer having a surface arsenic concentration of $5\times10^{18}$ to $5\times10^{19}$ cm$^{-3}$ has an excellent insulation characteristic because the time elapsed to cause a dielectric breakdown in a MOS capacitor with the arsenic diffusion layer described above under a fixed voltage is longer, as compared with that in a silicon oxide film obtained by thermally oxidizing the silicon substrate directly without forming an arsenic diffusion layer.

In a silicon oxide film obtained by thermal oxidation of an arsenic diffusion layer having a surface arsenic concentration of $5\times10^{18}$ cm$^{-3}$ to $5\times10^{19}$ cm$^{-3}$, the time elapsed to cause a dielectric breakdown is longer than that in a silicon oxide film obtained by thermal oxidation of an arsenic diffusion layer having a surface arsenic concentration higher than $5\times10^{19}$ cm$^{-3}$ and thus an excellent insulation characteristic is exhibited.

As is clear from the foregoing description, a semiconductor device such as a MOS capacitor using, as an insulating film or a dielectric film, a silicon oxide film obtained by thermal oxidation of an arsenic diffusion layer having a surface arsenic concentration within a range of $5\times10^{18}$ cm$^{-3}$ to $5\times10^{19}$ cm$^{-3}$ has an excellent insulation characteristic and therefore, has a high reliability.

Although in the above described embodiment, specified values are shown as to the crystal face of the silicon substrate, the thickness of the silicon oxide film to be removed, the process time and the process temperature in the heat treatment process etc., these values are mentioned by way of example only and the present invention is not limited thereto. Any parameter values may be used in so far as an arsenic diffusion layer having a surface arsenic concentration of $5 \times 10^{18}$ to $5 \times 10^{19}$ cm$^{-3}$ is formed.

Thus, according to the present invention, a silicon semiconductor device of MOS structure having an excellent insulation characteristic can be formed since a silicon oxide film obtained by thermal oxidation of an arsenic diffusion layer having a surface arsenic concentration of $5 \times 10^{18}$ cm$^{-3}$ to $5 \times 10^{19}$ cm$^{-3}$ is used as an insulating film or a dielectric film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device formed on a silicon substrate, comprising
    a silicon oxide film (30) obtained by thermal oxidation of an arsenic diffusion layer (20) formed in the surface of said silicon substrate, said arsenic diffusion layer (20) having a surface arsenic concentratin within a range of $5 \times 10^{18}$ cm$^{-3}$ to $5 \times 10^{19}$ cm$^{-3}$.

2. A semiconductor device in accordance with claim 1, further comprising a conductive layer (40) formed on said silicon oxide film, said semiconductor device being a semiconductor device of metal oxide semiconductor type comprising said silicon oxide film as an insulating film.

3. A metal oxide semiconductor device including a conductive layer, a silicon oxide insulating film layer, an arsenic diffusion layer, and a silicon substrate, said silicon oxide insulating film being obtained by thermal oxidation of said arsenic diffusion layer, said arsenic diffusion layer being formed in the surface of said silicon substrate and having a surface arsenic concentration within a range of $5 \times 10^{18}$ cm$^{-3}$ to $5 \times 10^{19}$ cm$^{-3}$.

* * * * *